United States Patent
Kim et al.

(10) Patent No.: US 7,581,881 B2
(45) Date of Patent: Sep. 1, 2009

(54) TEMPERATURE SENSOR USING RING OSCILLATOR AND TEMPERATURE DETECTION METHOD USING THE SAME

(75) Inventors: Chan-Kyung Kim, Gyeonggi-do (KR); Young-Hyun Jun, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 183 days.

(21) Appl. No.: 11/566,658

(22) Filed: Dec. 4, 2006

(65) Prior Publication Data
US 2007/0160113 A1 Jul. 12, 2007

(30) Foreign Application Priority Data
Jan. 11, 2006 (KR) .................. 10-2006-0003097

(51) Int. Cl.
*G01K 7/00* (2006.01)
(52) U.S. Cl. ...................... 374/170; 374/171
(58) Field of Classification Search ............... 374/170, 374/171
See application file for complete search history.

(56) References Cited

U.S. PATENT DOCUMENTS

| | | | | |
|---|---|---|---|---|
| 3,054,044 A * | 9/1962 | Shevel, Jr. | ............ | 323/250 |
| 3,882,728 A * | 5/1975 | Wittlinger | ............ | 374/112 |
| 4,092,586 A * | 5/1978 | Dinkler et al. | ............ | 324/419 |
| 4,172,384 A * | 10/1979 | Tamura et al. | ............ | 374/170 |
| 4,237,420 A * | 12/1980 | Ebihara et al. | ............ | 307/651 |
| 4,305,288 A * | 12/1981 | Morris, Jr. | ............ | 374/173 |
| 4,549,818 A | 10/1985 | Nishikubo et al. | | |
| 4,800,292 A * | 1/1989 | Gillett | ............ | 307/117 |
| 5,039,878 A * | 8/1991 | Armstrong et al. | ............ | 327/512 |
| 5,835,553 A | 11/1998 | Suzuki | | |
| 5,899,570 A * | 5/1999 | Darmawaskita et al. | ..... | 374/170 |
| 6,695,475 B2 * | 2/2004 | Yin | ............ | 374/171 |
| 6,934,652 B2 | 8/2005 | Gauthier et al. | | |
| 2004/0190585 A1 | 9/2004 | Berndlmaier et al. | | |

FOREIGN PATENT DOCUMENTS

| | | |
|---|---|---|
| DE | 102004049252 A1 | 5/2005 |
| JP | 11-002571 | 1/1999 |
| JP | 2000-329620 | 11/2000 |
| KR | 2005-0066205 | 6/2005 |
| TW | I227320 | 2/2005 |

OTHER PUBLICATIONS

English language abstract for Korean Publication No. 2005-0066205.
English language abstract for Japanese Publication No. 2000-329620.

* cited by examiner

*Primary Examiner*—Andre J Allen
(74) *Attorney, Agent, or Firm*—Marger Johnson & McCollom, P.C.

(57) ABSTRACT

Provided are a temperature sensor using a ring oscillator and temperature detection method using the same. One embodiment of the temperature sensor includes a first pulse generator, a second pulse generator, and a counter. The first pulse generator includes a first ring oscillator and generates a first clock signal having a variable period according to a change in temperature. The second pulse generator includes a second ring oscillator and generates a second clock signal having a fixed period. The counter counts a pulse width of the first clock signal as a function of a pulse width of the second clock signal and generates a temperature code.

20 Claims, 11 Drawing Sheets

TEMPERATURE SENSOR USING RING OSCILLATOR AND TEMPERATURE DETECTION METHOD USING THE SAME

BACKGROUND

This application claims the priority of Korean Patent Application No. 10-2006-03097, filed on Jan. 11, 2006, in the Korean Intellectual Property Office, the disclosure of which is incorporated herein in its entirety by reference.

1. Field of the Invention

The present invention relates to a semiconductor integrated circuit, and more particularly, to a temperature sensor using a ring oscillator and temperature detection method using the same.

2. Description of the Related Art

Semiconductor devices have temperature characteristics in terms of operations. Typical operational characteristics of semiconductor devices are consumption current IDD and operation speed tACCESS. FIG. 1 is a graph of temperature characteristics of a semiconductor device. Referring to FIG. 1, as the temperature increases, the operation speed increases (A) and the amount of the consumption current IDD decreases (B).

These temperature characteristics are of great importance to volatile memory devices such as dynamic random access memory (DRAMs). Since DRAM cells have an increase in the amount of leakage current as temperature rises, data maintenance abilities can be deteriorated due to charges, which reduces data maintenance time. To address this issue, DRAMs require a faster refresh operation. That is, it is necessary to provide a method of changing the refresh period of DRAMs according to temperatures because of the effect on data maintenance capabilities higher temperature changes has. To this end, a temperature sensor is required to sense the temperature inside DRAMs.

FIG. 2 is a circuit diagram of a conventional temperature sensor. Referring to FIG. 2, the temperature sensor 200 comprises a proportional to absolute temperature (PTAT) current generator 210, a complementary to absolute temperature (CTAT) current generator 220, and a comparator 230.

The PTAT current generator 210 comprises first and second PMOS transistors MP1 and MP2, first and second NMOS transistors MN1 and MN2, a resistor R, and first and second diodes D1 and D2. The first and second PMOS transistors MP1 And MP2 have the same size and include a first current mirror. The first and second NMOS transistors MN1 and MN2 have the same size and include a second current mirror. The size of the first and second diodes D1 and D2 has a ratio of 1:M.

Since the first current mirror of the first and second PMOS transistors MP1 and MP2 and the second current mirror of the first and second NMOS transistors MN1 and MN2 are symmetrical, amounts of currents Ia1 and Ia2 are identical to each other. That is, $Ia_1:Ia_2=1:1$.

A turned-on current ID of a general diode is indicated below, $$ID=Is*(e^{VD/VT}-1)=Is*(e^{VD/VT}) \quad (1)$$

wherein, Is denotes a contrary directional saturized current of the diode, VD denotes a diode voltage, and VT is a temperature voltage indicated as kT/q. Therefore, the current $Ia_1$ flows through the first diode D1 as indicated below, $$Ia1=Is*(e^{VD1/VT}) \quad (2)$$

A first diode voltage VD1 is $$VD1=VT*\ln(Ia1/Is) \quad (3)$$

A second diode voltage VD2 is $$VD2=VT*\ln(Ia2/(Is*M)) \quad (4)$$

Since the amounts of the currents $Ia_1$ and $Ia_2$ are identical to each other, the first diode voltage VD1 is almost the same as a present temperature voltage NOC0. Therefore, $$V(NOC0)=VD1=VD2+Ia2*R, \quad (5)$$

If equations 3 and 4 are substituted for equation 5, $$VT*\ln(Ia1/Is)=VT*\ln(Ia2/(Is*M))+Ia2*R \quad (6)$$

Therefore, the current $Ia_2$ is $$Ia2=VT*\ln(M)/R \quad (7)$$

Thus, the current $Ia_1$ is proportional to a temperature. That is, the PTAT current generator 210 generates the current $Ia_1$ proportional to a current temperature.

The CTAT current generator 220 comprises a third PMOS transistor MP3, a third NMOS transistor MN3, a plurality of resistors Raa, RU1~RU5, and RD1~RD5, and a plurality of switching transistors TU1~TU5 and TD1~TD5.

The third NMOS transistor MN3 connects to first and second NMOS transistors MN1 and MN2 and a current mirror. An amount of a current Ib is almost identical to the amounts of the currents $Ia_1$ and $Ia_2$. The switching transistors TU1~TU5 and TD1~TD5 are selectively turned on/off in response to trip temperature control signals AU1~AU5 and AD1~AD5, so that the resistors RU1~RU5, and RD1~RD5 connected to the turned-on switching transistors TU1~TU5 and TD1~TD5 are selectively short-circuited.

If the amounts of the currents Ib, $Ia_1$, and $Ia_2$ are almost identical to one another, VA and VB node voltages of the PTAT current generator 210 are almost the same as a VC node voltage of the CTAT current generator 220. In equations 3 and 4, a VT voltage increases as the temperature increases; however, an amount of the current Is increases greater than the amount of the VT voltage. A diode voltage is reduced as the temperature decreases. Therefore, an amount of the current Ib that flows through the resistors Raa, RU1~RU5, and RD1~RD5 is reduced as the temperature increases. That is, the current generated by the CTAT current generator 220 is in inverse proportional to the temperature.

The comparator 230 compares the present temperature voltage NOC0 and a sensed temperature voltage NOC1. The present temperature voltage NOC0 and a sensed temperature voltage NOC1 are determined using the current $Ia_1$ and the current Ib, respectively. The temperature sensor 200 detects a present temperature at a point where the amount of the currents $Ia_1$ and Ib are identical to each other as illustrated in FIG. 3. FIG. 3 is a graph explaining the temperature detection method using the temperature sensor illustrated in FIG. 2.

Referring to FIG. 3, the current $Ia_1$ is proportional to the temperature, whereas the current Ib is in inverse proportional to the temperature. For example, when a present temperature of a chip including the temperature sensor 200 is 45° C. If the amount of the Ib current is less than the amount of the current $Ia_1$, the trip temperature signals AU1~AU5 and AD1~AD5 of the CTAT current generator 220 are selectively enabled to control a resistance value of the CTAT current generator 220 and to flow a great amount of the current Ib (C), so that the amounts of the currents Ib and $Ia_1$ are substantially identical to each other.

To the contrary, if the amount of the Ib current is greater than the amount of the current $Ia_1$, the trip temperature signals AU1~AU5 and AD1~AD5 of the CTAT current generator 220 are selectively disabled to control the resistance value of the CTAT current generator 220 and to flow a small amount of the current Ib (D), so that the amounts of the currents Ib and $Ia_1$ are identical to each other. If the amounts of the currents Ib and $Ia_1$ are identical to each other, the temperature sensor 200 senses the present temperature of the chip, i.e. 45° C.

However, the temperature sensor 200 uses a bipolar transistor of an NPN transistor or a PNP transistor in order to realize the first and second diodes D1 and D2. The NPN transistor or the PNP transistor has analog operational characteristics, where the temperature sensor 200 may sense a nonlinear change in the temperature of the chip. Also, because both the NPN transistor and the PNP transistors are large, their inclusion increases the area of the chip.

SUMMARY

The present invention provides a ring oscillator having a variable linear period according to temperature and a temperature sensor that includes the ring oscillator and has a fixed period according to the temperature. The present invention also provides a temperature detection method using the temperature sensor.

According to an embodiment of the present invention, a temperature sensor may include a first pulse generator, a second pulse generator, and a counter. The first pulse generator may be structured to generate a first clock signal having a variable period according to a change in a temperature. The second pulse generator may be structured to generate a second clock signal having a fixed period regardless of the change in the temperature. The counter may further be structured to count the pulse width of the first clock signal as a function of the pulse width of the second clock signal and generate a temperature code.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION

Figure 1:
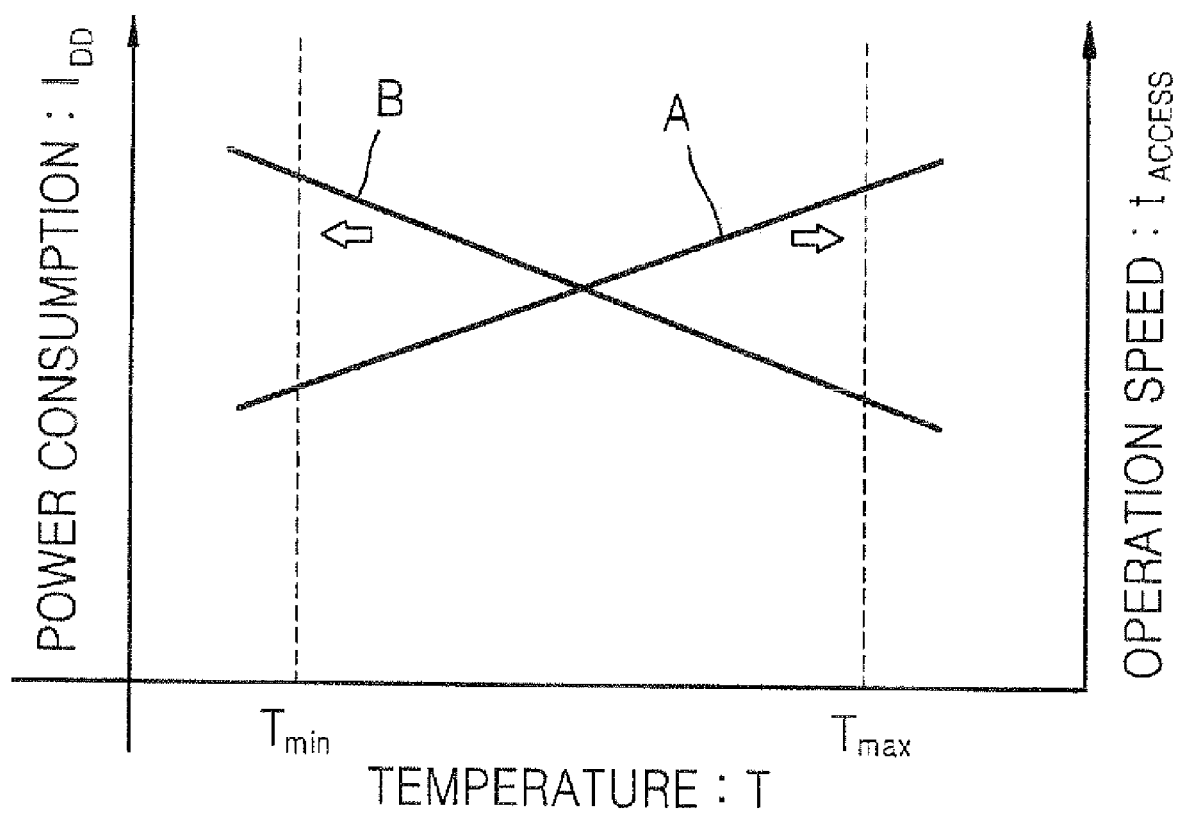
FIG. 1 is a graph of temperature characteristics of a semiconductor device.
Figure 2:
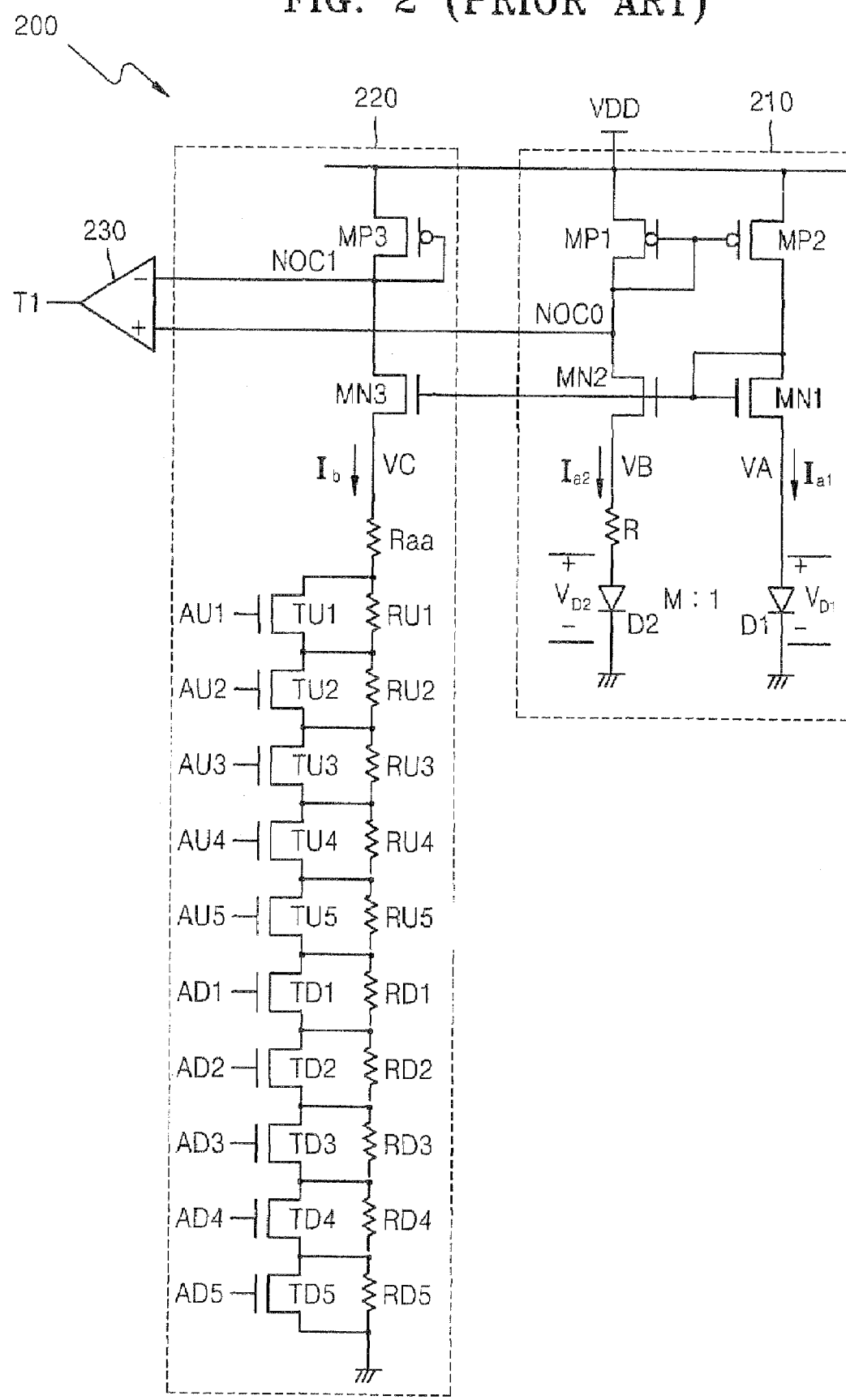
FIG. 2 is a circuit diagram of a conventional temperature sensor.
Figure 3:
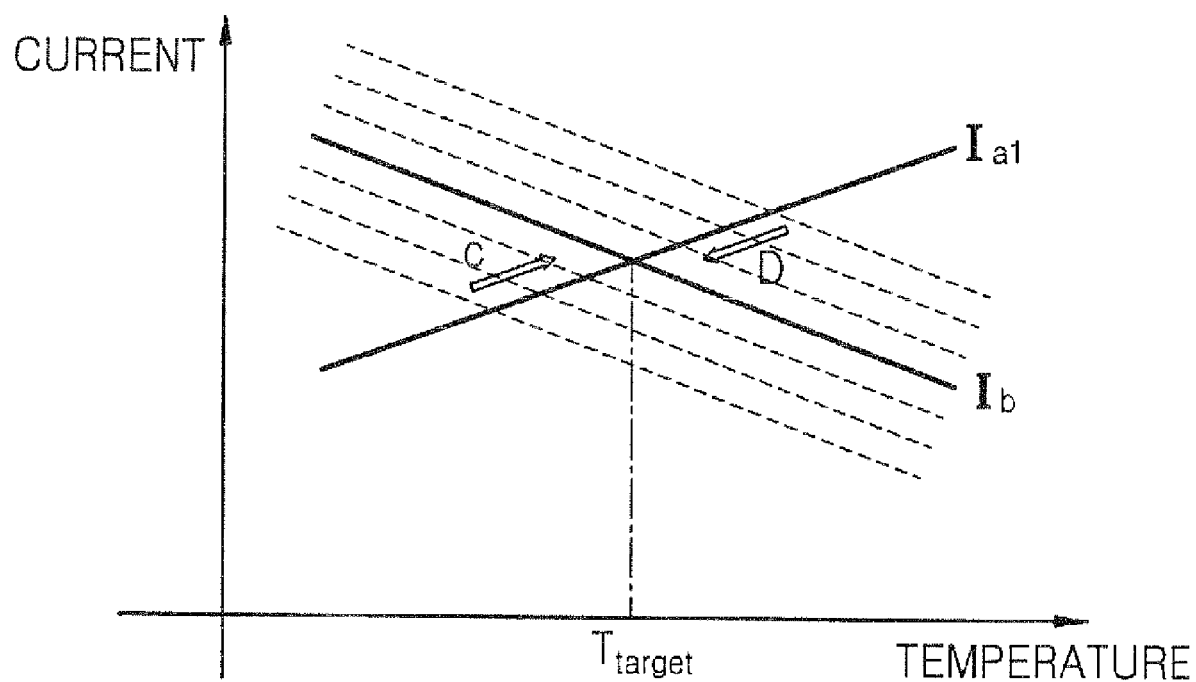
FIG. 3 is a graph of explaining a temperature detection method using the temperature sensor illustrated in FIG. 2.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and their description will be omitted.

Figure 4:
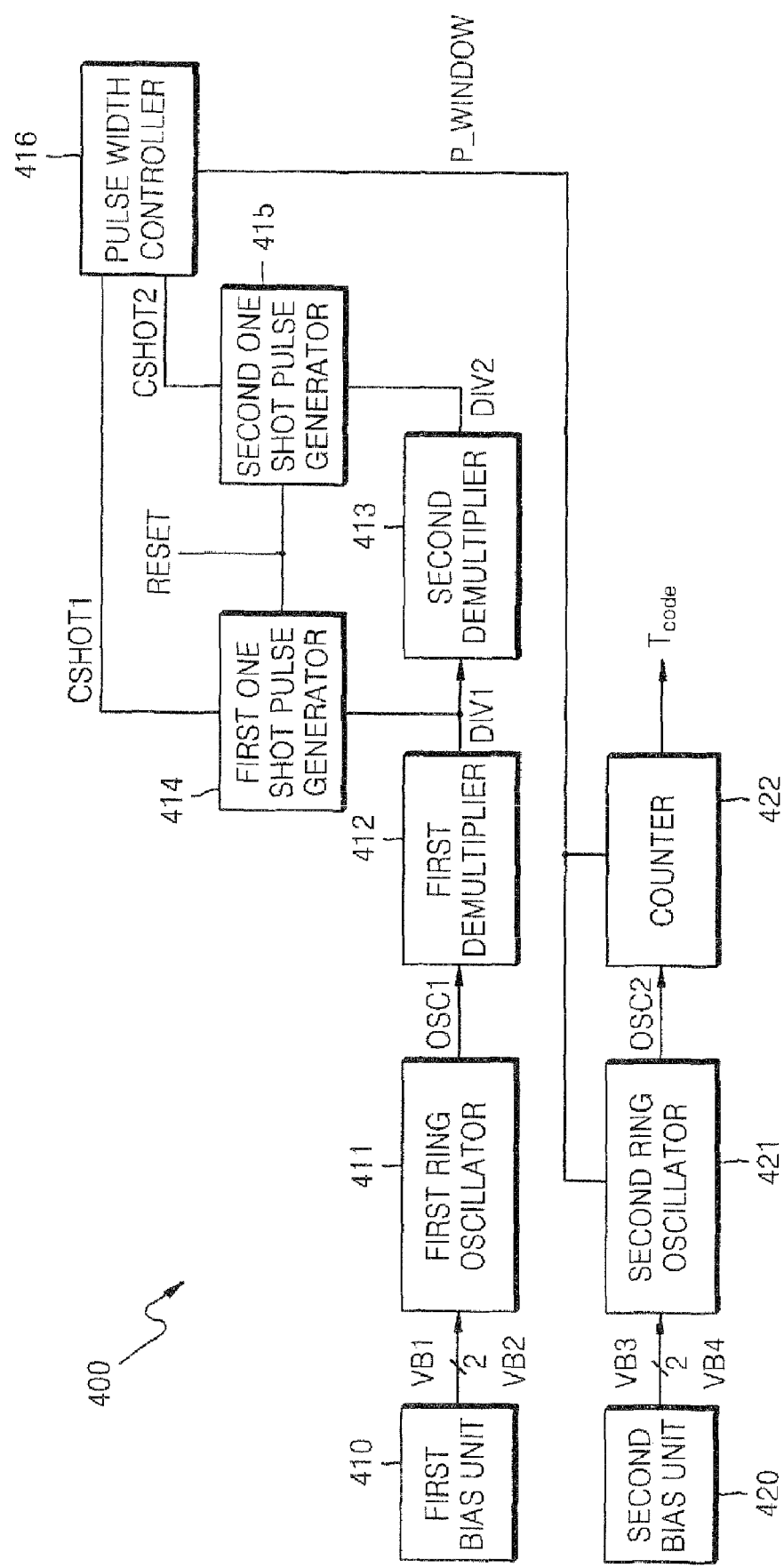
FIG. 4 is a block diagram of a temperature sensor according to an embodiment of the present invention.

FIG. 4 is a block diagram of a temperature sensor 400 according to an embodiment of the present invention, Referring to FIG. 4, the temperature sensor 400 comprises a first bias unit 410, a first ring oscillator 411, first and second demultipliers 412 and 413, first and second one-shot pulse generators 414 and 415, a pulse width controller 416, a second bias unit 420, a second ring oscillator 421, and a counter 422.

The first bias unit 410 has a variable amount of internal current according to the change in a temperature. First and second bias signals VB1 and VB2 of the first bias unit 410 are provided to the first ring oscillator 411 and vary the period of a first clock signal OSC1.

Figure 5:
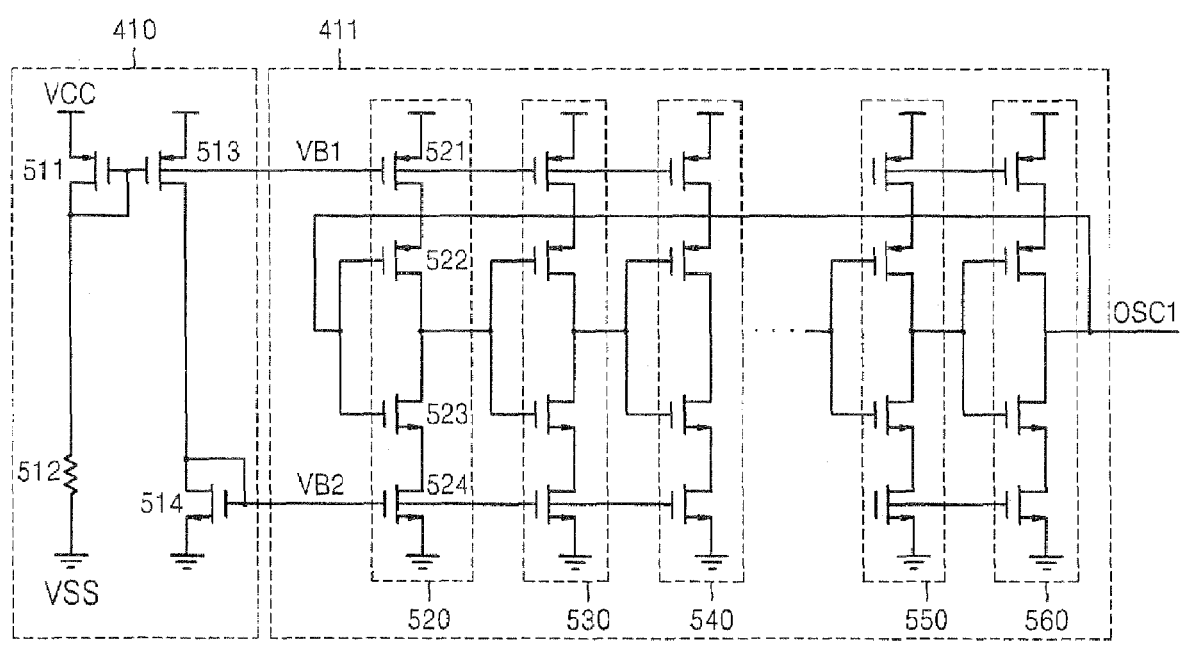
FIG. 5 is a circuit diagram of a first bias unit and a first ring oscillator illustrated in FIG. 4.

FIG. 5 is a circuit diagram of the first bias unit 410 and the first ring oscillator 411 illustrated in FIG. 4. Referring to FIG. 5, the first bias unit 410 comprises a first PMOS transistor 511 and a resistor 512 serially connected between a power voltage Vcc and a ground voltage Vss. A gate and drain of the first PMOS transistor 511 are interconnected. The first bias unit 410 further comprises a second PMOS transistor 513 and a NMOS transistor 514 serially connected between the power voltage Vcc and the ground voltage Vss. A gate of the second NMOS transistor 513 is connected to the gate of the first PMOS transistor 511, and the first and second PMOS transistors 511 and 513 comprise a current mirror. The gate and drain of the NMOS transistor 514 are interconnected. The gate of the first PMOS transistor 511 is a first bias signal VB1 and the gate of the NMOS transistor 514 is a second bias signal VB2.

In the first bias unit 410, the resistance value of the resistor 512 is increased as temperature increases so that an amount of current of the first PMOS transistor 511 and the mirrored second PMOS transistor 513 is reduced, and an amount of current of the NMOS transistor 514 serially connected to the second PMOS transistor 513 is reduced.

On the contrary, the resistance value of the resistor 512 is reduced as temperature decreases so that an amount of current of the first PMOS transistor 511, the second PMOS transistor 513, and the NMOS transistor 514 is increased.

The first ring oscillator 411 comprises a plurality of serially connected delay terminals 520, 530, 540, 550, and 560 that input the first and second bias signals VB1 and VB2. The first delay terminal 520 comprises first and second PMOS transistors 521 and 522 and first and second NMOS transistors 523 and 524, which are serially connected between power voltage Vcc and the ground voltage Vss. A gate of the first PMOS transistor 521 is connected to the first bias signal VB1, and a gate of the second NMOS transistor 524 is connected to the second bias signal VB2. Gates of the second PMOS transistor 522 and the first NMOS transistor 523 are connected to outputs of the final delay terminal 560. Drains of the second PMOS transistor 522 and the first NMOS transistor 523 are outputs of the first delay terminal 520. The output of the first delay terminal 520 is connected to an input of the second delay terminal 530.

The first PMOS transistor 521 of each of the delay terminals 520, 530, 540, 550, and 560 connects to the first PMOS transistor 511 of the first bias unit 410 and a current mirror. The second NMOS transistor 524 of each of the delay terminals 520, 530, 540, 550, and 560 connects to the NMOS transistor 514 of the first bias unit 410 and a current mirror.

The operation of the first ring oscillator 411 in connection with the operation of the first bias unit 410 will now be described.

As the temperature increases, the amounts of current of the first PMOS transistor 511 and the NMOS transistor 514 of the second bias unit 410 is reduced, and the amounts of current of the first PMOS transistor 521 and the second NMOS transistor 524 of each of the delay terminals 520, 530, 540, 550, and 560 is also reduced so that the operation speed of each of the delay terminals 520, 530, 540, 550, and 560 is reduced and the delay time of each of the delay terminals 520, 530, 540, 550, and 560 is correspondingly increased.

As the temperature decreases, the amounts of current of the first PMOS transistor 511 and the NMOS transistor 514 of the second bias unit 410 is increased, and the amounts of current of the first PMOS transistor 521 and the second NMOS transistor 524 of each of the delay terminals 520, 530, 540, 550, and 560 is also increased so that the operation speed of each of the delay terminals 520, 530, 540, 550, and 560 is increased and the delay time of each of the delay terminals 520, 530, 540, 550, and 560 is correspondingly reduced.

Figure 6:
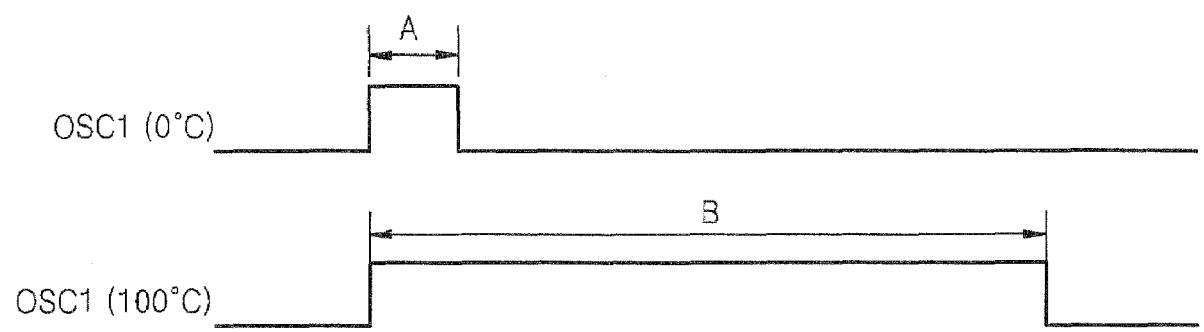
FIG. 6 illustrates a pulse width of a first clock signal of the first ring oscillator according to the temperature.

FIG. 6 illustrates a pulse width of the first clock signal OSC1 of the first ring oscillator 411 according to the temperature. The pulse width A of the first clock signal OSC1 is longer at the temperature of 0° C. than at the temperature of 100° C.

Figure 7:
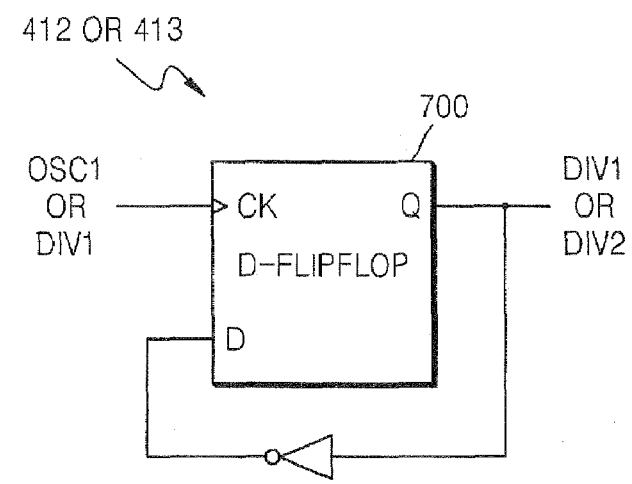
FIG. 7 is a block diagram of first and second demultipliers illustrated in FIG. 4.

Referring back to FIG. 4, the first demultiplier 412 inputs the first clock signal OSC1 and demultiplies the period of the first clock signal OSC1 twice (×2). FIG. 7 is a block diagram of first and second demultipliers 412 and 413 illustrated in FIG. 4. Referring to FIG. 7, the first demultiplier 412 comprises a D-flipflop 700 that inputs the first clock signal OSC1 as a clock signal CK, inverts a first demultiply signal DIV1 as an output signal Q, and feeds back the inverted first demultiply signal as data D.

The second demultiplier 413 also comprises a D-flipflop 700. However, the D-flipflop 700 of the second demultiplier 413 inputs the first demultiply signal DIV1 of the first demultiplier 412 as a clock signal CK, inverts a second demultiply signal DIV2 as an output signal Q, and feeds back the inverted second demultiply signal as data D. The second demultiply signal DIV2 has a period demultiplied twice that of the period of the first demultiply signal DIV1, and demultiplied four times that of the period of the first clock signal OSC1.

Figure 8:
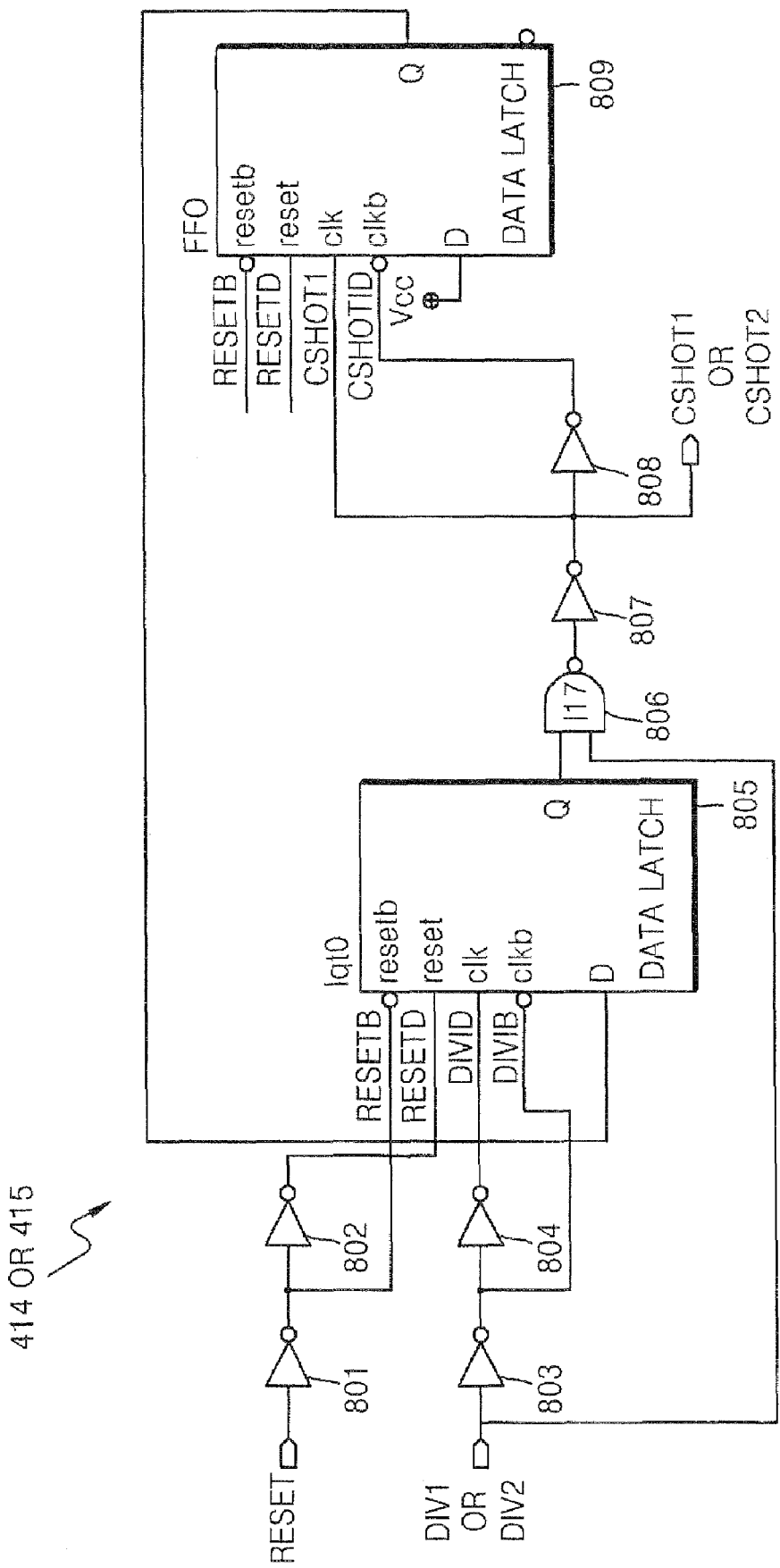
FIG. 8 is a circuit diagram of first and second one-shot pulse generators illustrated in FIG. 4.

The first and second demultiply signals DIV1 and DIV2 are generated based on the first ring oscillator 411 and thus are oscillated. Referring back to FIG. 4, the first one-shot pulse generator 414 detects one of pulses of the first demultiply signal DIV1 and generates a first one shot pulse CSHOT1. The second one-shot pulse generator 415 detects one of pulses of the second demultiply signal DIV2 and generates a second one-shot pulse CSHOT2. FIG. 8 is a circuit diagram of the first and second one-shot pulse generators 414 and 415 illustrated in FIG. 4. Referring to FIG. 8, the first one-shot pulse generator 414 comprises a first inverter 801 that inputs a reset signal RESET and outputs an inverted reset signal RESETB, a second inverter 802 that inputs the inverted reset signal RESETB, and outputs a delayed reset signal RESETD, a third inverter 803 that inputs the first demultiply signal DIV1 and outputs an inverted first demultiply signal DIV1B, and a fourth inverter 804 that inputs the inverted first demultiply signal DIV1B and outputs a delayed first demultiply signal DIV1D.

The first one-shot pulse generator 414 further comprises a first data latch 805 that is reset in response to the inverted reset signal RESETB and the delayed reset signal RESETD, and latches an output of a second data latch 809 in response to the inverted first demultiply signal DIV1B and the delayed first demultiply signal DIV1D.

The first one-shot pulse generator 414 further comprises a first NAND gate 806 that inputs the first demultiply signal DIV1 and an output of the first data latch 805, a fifth inverter 807 that inputs an output of the first NAND gate 806 and outputs the first one-shot pulse CSHOT1, a sixth inverter 808 that inputs the first one-shot pulse CSHOT1 and outputs a delayed first one-shot pulse CSHOT1D, and the second data latch 809 that is reset in response to the inverted reset signal RESETB and the delayed reset signal RESETD and latches the power voltage Vcc in response to the first one-shot pulse CSHOT1 and the delayed first one-shot pulse CSHOT1D.

The first one-shot pulse generator 414 inputs the oscillating first demultiply signal DIV1 and latches data twice to generate the first one-shot pulse CSHOT1 having one pulse.

The second one-shot pulse generator 415 has the same constitution as the first one-shot pulse generator 414. The second one-shot pulse generator 415 inputs the oscillating second demultiply signal DIV2 and latches data twice to generate a second one-shot pulse CSHOT2 having one pulse.

Referring back to FIG. 4, the pulse width controller 416 generates a pulse width window signal P_WINDOW in response to inputs of the first and second one-shot pulses CSHOT1 and CSHOT2. In some embodiments, the pulse width controller 415 can be a logic circuit that performs an XOR operation of the first and second one-shot pulses CSHOT1 and CSHOT2.

Figure 9:
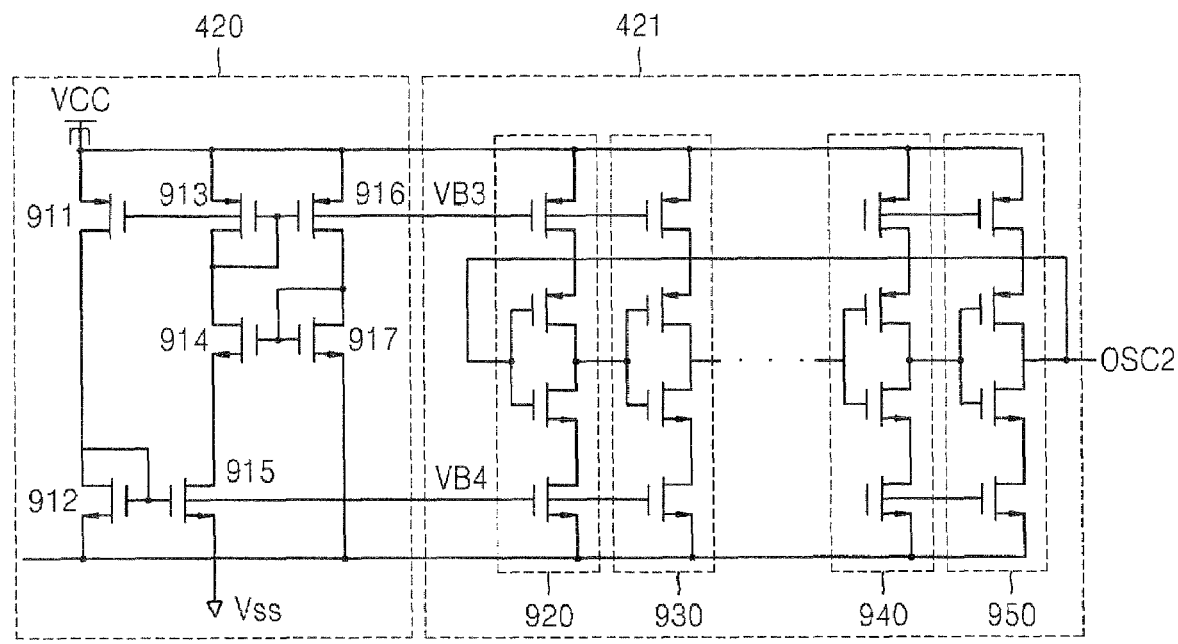
FIG. 9 is a circuit diagram of a second bias unit and a second ring oscillator illustrated in FIG. 4.

FIG. 9 is a circuit diagram of the second bias unit 420 and the second ring oscillator 421 illustrated in FIG. 4. Referring to FIG. 9, the second bias unit 420 comprises a first PMOS transistor 911 and a first NMOS transistor 912 serially connected between the power voltage Vcc and the ground voltage Vss. A gate and drain of the first NMOS transistor 912 are interconnected to generate a fourth bias signal VB4.

The second bias unit 420 further comprises a second PMOS transistor 913 and second and third NMOS transistors 914 and 915 serially connected between the power voltage Vcc and the ground voltage Vss. A gate and drain of the second NMOS transistor 913 are interconnected, and the gate of the second NMOS transistor 913 is connected a gate of the first PMOS transistor 911 to generate a third bias signal VB3. A gate of the third NMOS transistor 915 is connected to the gate of the first NMOS transistor 912.

The second bias unit 420 further comprises a third PMOS transistor 916 and fourth NMOS transistors 917 serially connected between the power voltage Vcc and the ground voltage Vss. A gate of the third PMOS transistor 916 is connected to the gate of the first PMOS transistor 911. A gate and drain of the fourth NMOS transistors 917 are interconnected.

In the second bias unit 420, the first, second and third PMOS transistors 911, 913, and 916 include a current mirror, the first and third NMOS transistor 912 and 915 include another current mirror, and the second and fourth NMOS transistors 914 and 917 include another current mirror. Therefore, the second bias unit 420 has a fixed amount of an internal current according to the change in the temperature.

The second ring oscillator 421 comprises a plurality of serially connected delay terminals 920, 930, 940, and 950 that input the third and fourth bias signals VB3 and VB4. Each of the delay terminals 920, 930, 940, and 950 has the same constitution as the first delay terminal 520 illustrated in FIG. 5. Since each of the delay terminals 920, 930, 940, and 950 is operated with the second bias unit 420 in the manner of a current mirror, each of the delay terminals 920, 930, 940, and 950 has a fixed current according to the change in the temperature. Therefore, each of the delay terminals 920, 930, 940, and 950 has a fixed delay time. The second ring oscillator 421 generates a second clock signal OSC2 that is fed back to the first delay terminal 920 and oscillates. The second clock signal OSC2 is an output of the final delay terminal 950. The second clock signal OSC2 has a fixed period regardless of the change in the temperature.

The second ring oscillator 421 can generate the second clock signal OSC2 when the pulse width window signal P_WINDOW generated by the pulse width controller 415 is activated in order to reduce power consumption.

Figure 10:
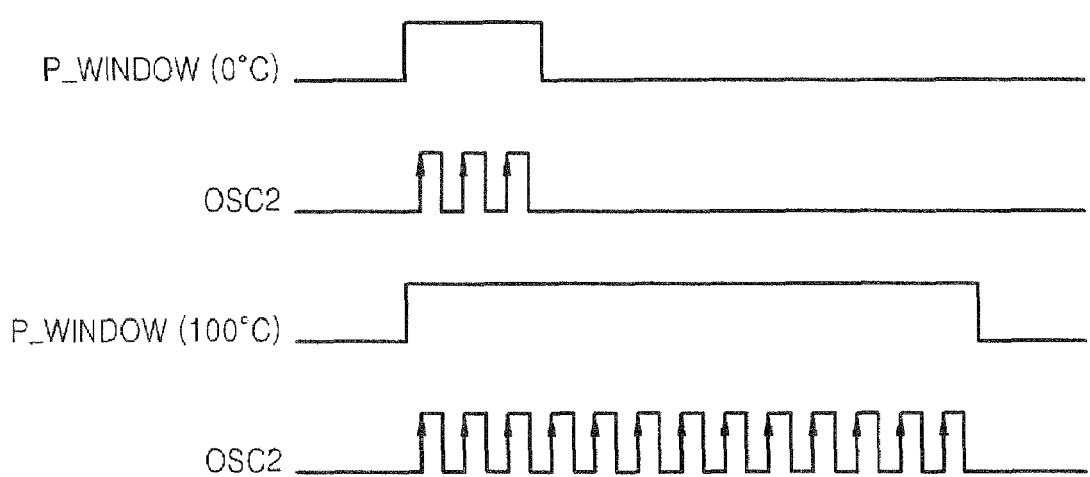
FIG. 10 illustrates a pulse width window signal and a second clock signal according to a change in a temperature.

Referring back again to FIG. 4, the counter 422 inputs the pulse width window signal P_WINDOW and the second clock signal OSC2 and generates a digital code Tcode. The digital code Tcode indicates the number of pulses of the second clock signal OSC2 counted when the pulse width window signal P_WINDOW is activated. FIG. 10 illustrates the pulse width window signal P_WINDOW and the second clock signal OSC2 according to the change in the temperature. Referring to FIG. 10, the second clock signal OSC2 has three pulses when the pulse width window signal P_WINDOW is activated at the temperature of 0° C., and the second clock signal OSC2 has thirteen pulses when the pulse width window signal P_WINDOW is activated at the temperature of 100° C. The number of digital codes Tcode generated by the counter 422 corresponds to the number of pulses of the second clock signal OSC2.

Therefore, the temperature sensor 400 of the present invention counts pulses of the second clock signal OSC2 when the pulse width window signal P_WINDOW generated by the first clock signal OSC1 is activated using the first clock signal OSC1 of the first ring oscillator 411 having a variable pulse width according to the change in the temperature and the second clock signal OSC2 of the second ring oscillator 421 having a fixed pulse width according to the change in the temperature. The temperature sensor 400 indicates a sensed temperature using the counted digital code Tcode so that the sensed temperature has linearity.

Figure 11:
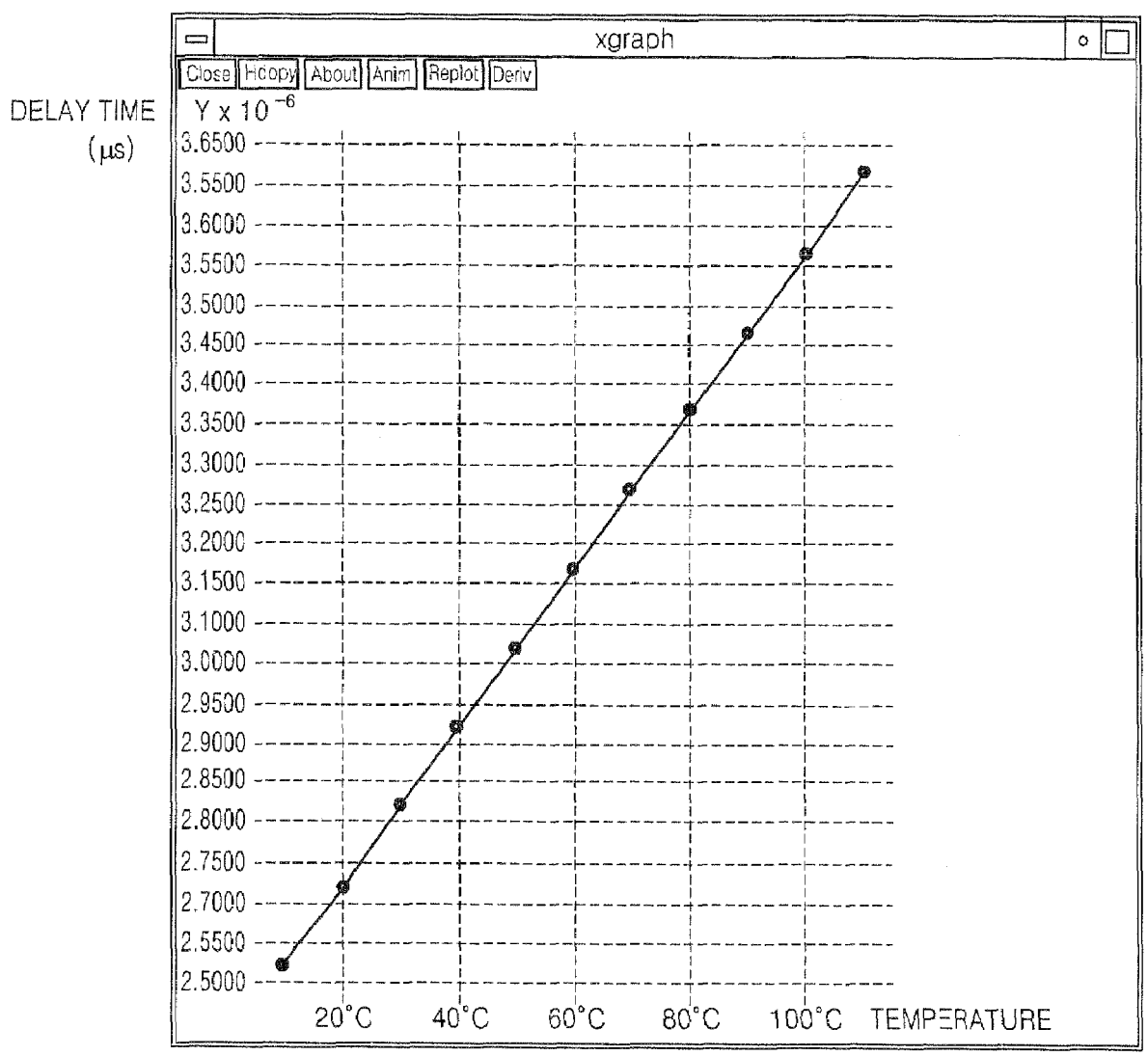
FIG. 11 is a graph illustrating variances in a period of the first clock signal of the first ring oscillator according to the change in the temperature.
Figure 12:
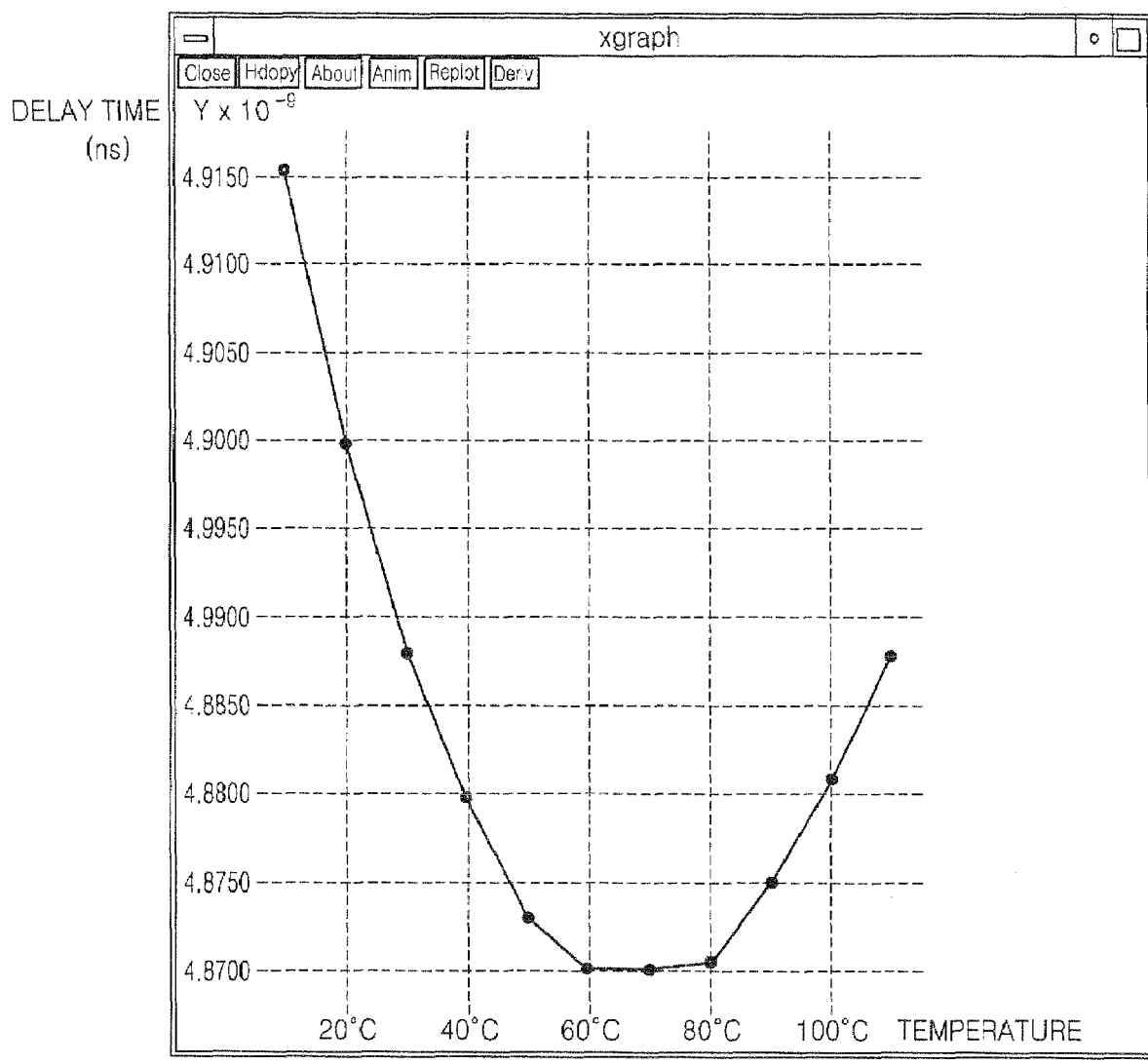
FIG. 12 is a graph illustrating variances in a period of the second clock signal of the second ring oscillator according to the change in the temperature.
Figure 13:
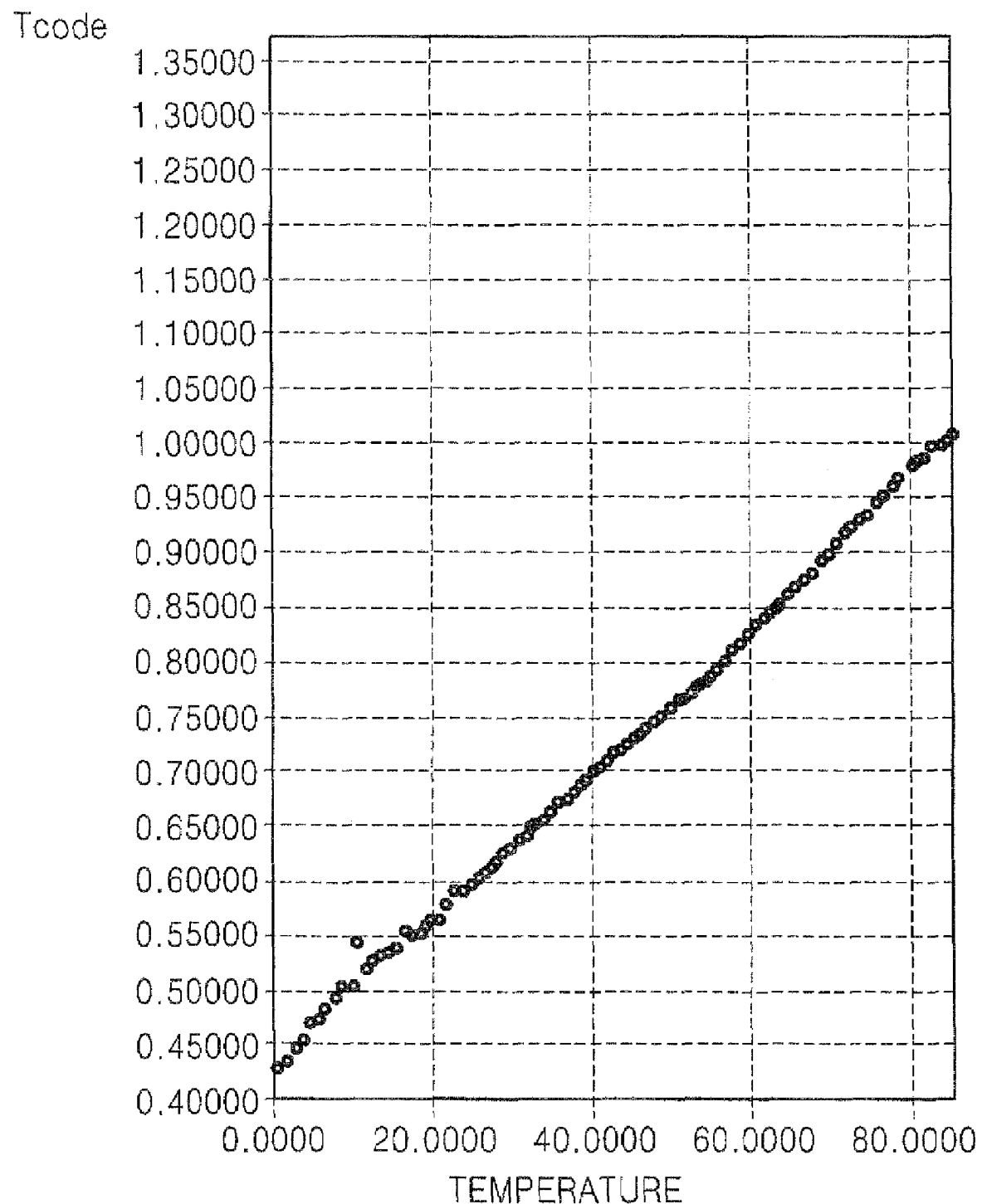
FIG. 13 is a graph illustrating a linear digital code obtained by simulating the temperature sensor illustrated in FIG. 4 according to the change in the temperature.

FIGS. 11 through 13 are graphs illustrating results obtained by simulating an embodiment of the temperature sensor 400. FIG. 11 is a graph illustrating variances in a period of the first clock signal OSC1 of the first ring oscillator 411 according to the change in the temperature. FIG. 12 is a graph illustrating variances in a period of the second clock signal OSC2 of the second ring oscillator 412 according to the change in the temperature. Referring to FIG. 11, a Y-axis has a unit of microseconds (μs). Referring to FIG. 12, a Y-axis has a unit of nanoseconds (ns). FIG. 13 is a graph illustrating a linear digital code Tcode according to the change in the temperature.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A temperature sensor, comprising:
    a first bias unit having a variable amount of an internal current that varies in response to temperature and generating first and second bias signals;
    a second bias unit having a fixed amount of an internal current and generating third and fourth bias signals;
    a first ring oscillator generating a first clock signal in response to the first and second bias signals;
    a second ring oscillator generating a second clock signal in response to the third and fourth bias signals;
    a one-shot pulse generator latching one pulse of the first clock signal and generating a one-shot pulse; and
    a temperature code generator counting a width of the one-shot pulse as a pulse of the second clock signal and generating a temperature code,
    wherein the first bias unit includes:
        a first PMOS transistor having a source connected to a power voltage, and having an interconnected gate and drain;
        a resistor connected between the drain of the first PMOS transistor and a ground voltage;
        a second PMOS transistor having a source connected to the power voltage and having a gate connected to the gate of the first PMOS transistor to generate the first bias signal; and
        an NMOS transistor having a gate and drain connected to a drain of the second PMOS transistor to generate the second bias signal, and having a source connected to the ground voltage.

2. The temperature sensor of claim 1, wherein the first ring oscillator comprises a plurality of serially connected delay terminals that feed back the first clock signal and outputs the first clock signal in response to the first and second bias signals and the fed back first clock signal.

3. The temperature sensor of claim 2, wherein one of the delay terminals comprises:
    a first PMOS transistor having a source connected to the power voltage, and having a gate connected to the first bias signal;
    a second PMOS transistor having a source connected to a drain of the first PMOS transistor, and having a gate connected to an output signal of a previous delay terminal;
    a first NMOS transistor having a drain connected to a drain of the second PMOS transistor to generate an output signal of the delay terminal, and having a gate connected to the output signal of the previous delay terminal; and
    a second NMOS transistor having a drain connected to a source of the first NMOS transistor, having a gate connected to the second bias signal, and having a source connected to the ground voltage.

4. The temperature sensor of claim 3, wherein the second bias unit comprises:
    a first PMOS transistor having a source connected to the power voltage;
    a first NMOS transistor having a gate and drain connected to a drain of the first PMOS transistor and having a source connected to the ground voltage;
    a second PMOS transistor having a source connected to the power voltage and having an interconnected gate and drain;
    a second NMOS transistor having a source connected to the drain of the second PMOS transistor;
    a third NMOS transistor having a drain connected to a drain of the second NMOS transistor, having a gate connected to the gate of the first NMOS transistor to generate the fourth bias signal, and having a source connected to the ground voltage;

a third PMOS transistor having a source connected to the power voltage, and having a gate connected to the gate of the second PMOS transistor to generate the third bias signal; and a fourth NMOS transistor having a gate and drain connected to a drain of the third PMOS transistor and a gate of the second NMOS transistor, and having a source connected to the ground voltage.

5. The temperature sensor of claim 4, wherein the second ring oscillator comprises a plurality of serially connected delay terminals that feed back the second clock signal and output the second clock signal in response to the third and fourth bias signals and the fed back second clock signal.

6. The temperature sensor of claim 4, wherein the second ring oscillator comprises a plurality of serially connected delay terminals that are enabled by the one-shot pulse, feed back the second clock signal, and outputs the second clock signal in response to the third and fourth bias signals and the fed back second clock signal.

7. The temperature sensor of claim 1, wherein the one-shot pulse generator comprises:
a first inverter inputting a reset signal and outputting an inverted reset signal;
a second inverter inputting the inverted reset signal and outputting a delayed reset signal;
a third inverter inputting the first clock signal and outputting an inverted first clock signal;
a fourth inverter inputting the inverted first clock signal and outputting a delayed first clock signal;
a first data latch resetted in response to the inverted reset signal and the delayed reset signal, and latching an output of a second data latch in response to the inverted first clock signal and the delayed first clock signal;
a first NAND gate inputting the first clock signal and an output of the first data latch;
a fifth inverter inputting an output of the first NAND gate and outputting the one-shot pulse;
a sixth inverter inputting the one-shot pulse and a delayed one-shot pulse; and
the second data latch resetted in response to the inverted reset signal and the delayed reset signal, and latching the power voltage in response to the one-shot pulse and the delayed one-shot pulse.

8. A temperature sensor, comprising:
a first bias unit having an amount of internal current that varies in response to temperature and generating first and second bias signals;
a second bias unit having a fixed amount of an internal current and generating third and fourth bias signals;
a first ring oscillator generating a first clock signal in response to the first and second bias signals;
a second ring oscillator generating a second clock signal in response to the third and fourth bias signals;
a first demultiplier demultiplying the first clock signal and generating a first demultiply signal;
a first one-shot pulse generator latching one pulse of the first demultiply signal and generating a first shot pulse;
a second demultiplier demultiplying the first demultiply signal and generating a second demultiply signal;
a second one-shot pulse generator latching one pulse of the first demultiply signal and generating a second shot pulse;

a pulse width controller inputting the first and second one-shot pulses and generating a pulse width window signal; and a temperature code generator counting a pulse width of the second clock signal as a function of a pulse width of the pulse width window signal and generating a temperature code.

9. The temperature sensor of claim 8, wherein the first bias unit comprises:
a first PMOS transistor having a source connected to a power voltage, and having an interconnected gate and drain;
a resistor connected between the drain of the first PMOS transistor and a ground voltage;
a second PMOS transistor having a source connected to the power voltage and having a gate connected to the gate of the first PMOS transistor to generate the first bias signal; and
an NMOS transistor having a gate and drain connected to a drain of the second PMOS transistor to generate the second bias signal, and having a source connected to the ground voltage.

10. The temperature sensor of claim 8, wherein the first ring oscillator comprises a plurality of serially connected delay terminals that feed back the first clock signal and output the first clock signal in response to the first and second bias signals and the fed back first clock signal.

11. The temperature sensor of claim 10, wherein one of the delay terminals comprises:
a first PMOS transistor having a source connected to the power voltage, and having a gate connected to the first bias signal;
a second PMOS transistor having a source connected to a drain of the first PMOS transistor, and having a gate connected to an output signal of a previous delay terminal;
a first NMOS transistor having a drain connected to a drain of the second PMOS transistor to generate an output signal of the previous delay terminal, and having a gate connected to the output signal of the delay terminal; and
a second NMOS transistor having a drain connected to a source of the first NMOS transistor, having a gate connected to the second bias signal, and having a source connected to the ground voltage.

12. The temperature sensor of claim 8, wherein the second bias unit comprises:
a first PMOS transistor having a source connected to the power voltage;
a first NMOS transistor having a gate and drain connected to a drain of the first PMOS transistor and having a source connected to the ground voltage;
a second PMOS transistor having a source connected to the power voltage and having an interconnected gate and drain;
a second NMOS transistor having a source connected to the drain of the second PMOS transistor;
a third NMOS transistor having a drain connected to a drain of the second NMOS transistor, having a gate connected to the gate of the first NMOS transistor to generate the fourth bias signal, and having a source connected to the ground voltage;
a third PMOS transistor having a source connected to the power voltage, and having a gate connected to the gate of the second PMOS transistor to generate the third bias signal; and
a fourth NMOS transistor having a gate and drain connected to a drain of the third PMOS transistor and a gate of the second NMOS transistor, and having a source connected to the ground voltage.

13. The temperature sensor of claim 8, wherein the second ring oscillator comprises a plurality of serially connected delay terminals that feed back the second clock signal and output the second clock signal in response to the third and fourth bias signals and the fed back second clock signal.

14. The temperature sensor of claim 8, wherein the second ring oscillator comprises a plurality of serially connected delay terminals that are enabled by the one-shot pulse, feedback the second clock signal, and outputs the second clock signal in response to the third and fourth bias signals and the fed back second clock signal.

15. The temperature sensor of claim 8, wherein the first demultiply unit comprises a D-flipflop that inputs the first clock signal as a clock signal, inverts the first demultiply signal as an output signal, and feeds back the inverted first demultiply signal as data.

16. The temperature sensor of claim 8, wherein the first one-shot pulse generator comprises:
　a first inverter inputting a reset signal and outputting an inverted reset signal;
　a second inverter inputting the inverted reset signal and outputting a delayed reset signal;
　a third inverter inputting the first demultiply signal and outputting an inverted first demultiply signal;
　a fourth inverter inputting the inverted first demultiply signal and outputting a delayed first demultiply signal;
　a first data latch resetted in response to the inverted reset signal and the delayed reset signal, and latching an output of a second data latch in response to the inverted first demultiply signal and the delayed first demultiply signal;
　a first NAND gate inputting the first demultiply signal and an output of the first data latch;
　a fifth inverter inputting an output of the first NAND gate and outputting the first one-shot pulse;
　a sixth inverter inputting the first one-shot pulse and a delayed first one-shot pulse; and
　the second data latch resetted in response to the inverted reset signal and the delayed reset signal, and latching the power voltage in response to the first one-shot pulse and the delayed first one-shot pulse.

17. The temperature sensor of claim 8, wherein the second demultiply unit comprises a D-flipflop that inputs the first demultiply signal as a clock signal, inverts the second demultiply signal as an output signal, and feeds back the inverted second demultiply signal as data.

18. The temperature sensor of claim 8, wherein the second one-shot pulse generator comprises:
　a first inverter inputting a reset signal and outputting an inverted reset signal;
　a second inverter inputting the inverted reset signal and outputting a delayed reset signal;
　a third inverter inputting the second demultiply signal and outputting an inverted second demultiply signal;
　a fourth inverter inputting the inverted second demultiply signal and outputting a delayed second demultiply signal;
　a first data latch resetted in response to the inverted reset signal and the delayed reset signal, and latching an output of a second data latch in response to the inverted second demultiply signal and the delayed second demultiply signal;
　a first NAND gate inputting the second demultiply signal and an output of the first data latch;
　a fifth inverter inputting an output of the first NAND gate and outputting the second one-shot pulse;
　a sixth inverter inputting the second one-shot pulse and a delayed second one-shot pulse; and
　the second data latch resetted in response to the inverted reset signal and the delayed reset signal, and latching the power voltage in response to the second one-shot pulse and the delayed second one-shot pulse.

19. A temperature detection method, comprising:
　generating a first clock signal having a period that varies in response to temperature;
　generating a second clock signal having a fixed period;
　demultiplying the first clock signal and generating a first demultiply signal;
　latching one pulse of the first demultiply signal and generating a first one-shot pulse;
　demultiplying the first demultiply signal and generating a second demultiply signal;
　latching one pulse of the first demultiply signal and generating a second one-shot pulse;
　inputting the first and second one-shot pulses and generating a pulse width window signal; and
　counting a pulse width of the pulse width window signal as a function of a pulse width of the second clock signal and generating a temperature code.

20. The temperature detection method of claim 19, wherein the first and second clock signals are generated using a ring oscillator.

\* \* \* \* \*

UNITED STATES PATENT AND TRADEMARK OFFICE
CERTIFICATE OF CORRECTION

PATENT NO.         : 7,581,881 B2
APPLICATION NO. : 11/566658
DATED              : September 1, 2009
INVENTOR(S)        : Chan-Kyung Kim et al.

It is certified that error appears in the above-identified patent and that said Letters Patent is hereby corrected as shown below:

Column 4, line 19, the word "invention," should read -- invention. --.

Signed and Sealed this

Twenty-fourth Day of November, 2009

David J. Kappos
*Director of the United States Patent and Trademark Office*